US010598747B2

(12) United States Patent
Gulani et al.

(10) Patent No.: US 10,598,747 B2
(45) Date of Patent: Mar. 24, 2020

(54) SYSTEM AND METHOD FOR SIMULTANEOUS MULTISLICE MAGNETIC RESONANCE FINGERPRINTING WITH VARIABLE RADIO FREQUENCY ENCODING

(71) Applicants: Case Western Reserve University, Cleveland, OH (US); The General Hospital Corporation, Boston, MA (US)

(72) Inventors: Vikas Gulani, Shaker Heights, OH (US); Mark A. Griswold, Shaker Heights, OH (US); Alice Yang, Cleveland Heights, OH (US); Yun Jiang, Cleveland Heights, OH (US); Kawin Setsompop, Charlestown, MA (US)

(73) Assignees: Case Western Reserve University, Cleveland, OH (US); The General Hospital Corporation, Boston, MA (US)

( * ) Notice: Subject to any disclaimer, the term of this patent is extended or adjusted under 35 U.S.C. 154(b) by 0 days.

(21) Appl. No.: 15/946,922

(22) Filed: Apr. 6, 2018

(65) Prior Publication Data
US 2018/0292486 A1 Oct. 11, 2018

Related U.S. Application Data

(60) Provisional application No. 62/482,746, filed on Apr. 7, 2017.

(51) Int. Cl.
*G01R 33/483* (2006.01)
*G01R 33/56* (2006.01)
(Continued)

(52) U.S. Cl.
CPC ....... *G01R 33/4835* (2013.01); *G01R 33/246* (2013.01); *G01R 33/543* (2013.01);
(Continued)

(58) Field of Classification Search
CPC .............. G01R 33/4835; G01R 33/246; G01R 33/543; G01R 33/5608; G01R 33/561; G01R 33/243; G01R 33/50
See application file for complete search history.

(56) References Cited

U.S. PATENT DOCUMENTS 8,723,518 B2  5/2014 Seiberlich
2012/0235678 A1  9/2012 Seiberlich
(Continued)

OTHER PUBLICATIONS

Jiang et al. MR Fingerprinting using Fast Imaging with Steady State Precession (FISP) with Spiral Readout. Magnetic Resonance in Medicine. 2015; 74(6):1621-31.
(Continued)

*Primary Examiner* — Gregory H Curran
(74) *Attorney, Agent, or Firm* — Quarles & Brady LLP

(57) ABSTRACT

A magnetic resonance fingerprinting ("MRF") framework that implements simultaneous multislice acquisition techniques with a Hadamard RF-encoding to simultaneously acquire magnetic resonance data from multiple slices simultaneously is described. As one non-limiting example, magnetic resonance data can be simultaneously acquired from four different slices. In other embodiments, however, the Hadamard encoding can be condensed into one or two acquisitions, rather than four.

21 Claims, 3 Drawing Sheets

(51) Int. Cl.
*G01R 33/54* (2006.01)
*G01R 33/24* (2006.01)
*G01R 33/561* (2006.01)
*G01R 33/50* (2006.01)

(52) U.S. Cl.
CPC ....... *G01R 33/561* (2013.01); *G01R 33/5608* (2013.01); *G01R 33/243* (2013.01); *G01R 33/50* (2013.01)

(56) References Cited

U.S. PATENT DOCUMENTS

| 2015/0301141 | A1 | 10/2015 | Griswold | |
|---|---|---|---|---|
| 2015/0346300 | A1* | 12/2015 | Setsompop | G01R 33/4828 324/309 |
| 2017/0146625 | A1* | 5/2017 | Beck | G01R 33/4828 |
| 2018/0231626 | A1* | 8/2018 | Gulani | A61B 5/4312 |

OTHER PUBLICATIONS

Jiang et al. Use of pattern recognition for unaliasing simultaneously acquired slices in Simultaneous MultiSlice Magnetic Resonance Fingerprinting. In: Proceedings from the Interational Society for Magnetic Resonance in Medicine; May 30-Jun. 5, 2015; Toronto, CA. Abstract 0105.

Keenan Ke et al. Multi-site, multi-vendor comparison of T1 measurment using ISMRM/NIST system phantom. In: Proceedings of the International Society for Magnetic Resonance in medicine; May 7-May 13, 2016; Singapore, Abstract 3290.

Ma, Dan, et al. "Magnetic resonance fingerprinting."Nature 495. 7440 (2013): 187.

Russek Se, et al. Characterization of NIST/ISMRM MRI System Phantom. In: Proceedings of the International Society for Magnetic Resonance in Medicine; May 5-May 11, 2012; Melbourne. Abstract 2456.

Setsompop et al. Generalized SLice Dithered Enhanced Resolution Simultaneous MultiSlice (gSlider-SMS) to increase volume encoding, SNR and partition profile fidelity in high-resolution diffusing imaging. In: Proceedings from the International Society for magnetic Resonance in Medicine; May 7-May 13, 2016; Singapore. Abstract 0607.

Souza et al. SIMA: simultaneous multislice acquisition of MR images be Hadamard-encoded excitation. Journal of Computer Assisted Tomography. 1988; 12(6): 1036-30.

Wansapura JP et al. NMR relaxation times in the human brain at 3.0 tesla. Journal of Magnetic Resonance Imaging. 1999; 9(4): 531-8.

\* cited by examiner

SYSTEM AND METHOD FOR SIMULTANEOUS MULTISLICE MAGNETIC RESONANCE FINGERPRINTING WITH VARIABLE RADIO FREQUENCY ENCODING

CROSS-REFERENCE TO RELATED APPLICATIONS

This application is based on, claims priority to, and incorporates hereby reference in its entirety for all purposes, U.S. Provisional Application Ser. No. 62/482,746, filed Apr. 7, 2017, and entitled "SIMULTANEOUS MULTISLICE MAGNETIC RESONANCE FINGERPRINTING WITH VARIABLE RADIO FREQUENCY ENCODING."

BACKGROUND

Characterizing tissue species using nuclear magnetic resonance ("NMR") can include identifying different properties of a resonant species (e.g., T1 spin-lattice relaxation, T2 spin-spin relaxation, proton density). Other properties like tissue types and super-position of attributes can also be identified using NMR signals. These properties and others may be identified simultaneously using magnetic resonance fingerprinting ("MRF"), which is described, as one example, by D. Ma, et al., in "Magnetic Resonance Fingerprinting," Nature, 2013; 495 (7440): 187-192.

Conventional magnetic resonance imaging ("MRI") pulse sequences include repetitive similar preparation phases, waiting phases, and acquisition phases that serially produce signals from which images can be made. The preparation phase determines when a signal can be acquired and determines the properties of the acquired signal. For example, a first pulse sequence may produce a T1-weighted signal at a first echo time ("TE"), while a second pulse sequence may produce a T2-weighted signal at a second TE. These conventional pulse sequences typically provide qualitative results where data are acquired with various weightings or contrasts that highlight a particular parameter (e.g., T1 relaxation, T2 relaxation).

When magnetic resonance ("MR") images are generated, they may be viewed by a radiologist and/or surgeon who interprets the qualitative images for specific disease signatures. The radiologist may examine multiple image types (e.g., T1-weighted, T2 -weighted) acquired in multiple imaging planes to make a diagnosis. The radiologist or other individual examining the qualitative images may need particular skill to be able to assess changes from session to session, from machine to machine, and from machine configuration to machine configuration.

Unlike conventional MRI, MRF employs a series of varied sequence blocks that simultaneously produce different signal evolutions in different resonant species (e.g., tissues) to which the radio frequency ("RF") is applied. The signals from different resonant tissues will, however, be different and can be distinguished using MRF. The different signals can be collected over a period of time to identify a signal evolution for the volume. Resonant species in the volume can then be characterized by comparing the signal evolution to known evolutions. Characterizing the resonant species may include identifying a material or tissue type, or may include identifying MR parameters associated with the resonant species. The "known" evolutions may be, for example, simulated evolutions calculated from physical principles and/or previously acquired evolutions. A large set of known evolutions may be stored in a dictionary.

MRF provides an efficient way to simultaneously quantify multiple parameters, such as T1, T2, off-resonance, and proton density. The original implementation of MRF utilized a 2D slice-selective acquisition. A desirable step forward would be the ability to acquire multiple slices simultaneously in order to reduce scan time.

SUMMARY OF THE DISCLOSURE

The present disclosure addresses the aforementioned drawbacks by providing a method for generating quantitative images of a subject. A magnetic resonance imaging ("MRI") system is used to acquire magnetic resonance data in a series of variable sequence blocks having a multiband radio frequency ("RF") pulse and that cause one or more resonant species in the subject to simultaneously produce individual magnetic resonance signals in a plurality of different slices. The multiband RF pulse provides an RF encoding of the magnetic resonance signals. A coding matrix is then applied to the acquired magnetic resonance data in order to generate separated magnetic resonance data in which each of the magnetic resonance signals are separated into one of the plurality of different slice locations from which the magnetic resonance signal originated. The separated magnetic resonance data are compared to a dictionary of signal evolutions to determine quantitative values for two or more parameters of the resonant species based, at least in part, on matching the separated magnetic resonance data to a set of known signal evolutions stored in the dictionary. An image is displayed for each of the plurality of different slice locations depicting the subject at that slice location based, at least in part, on the quantitative values.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Figure 1:
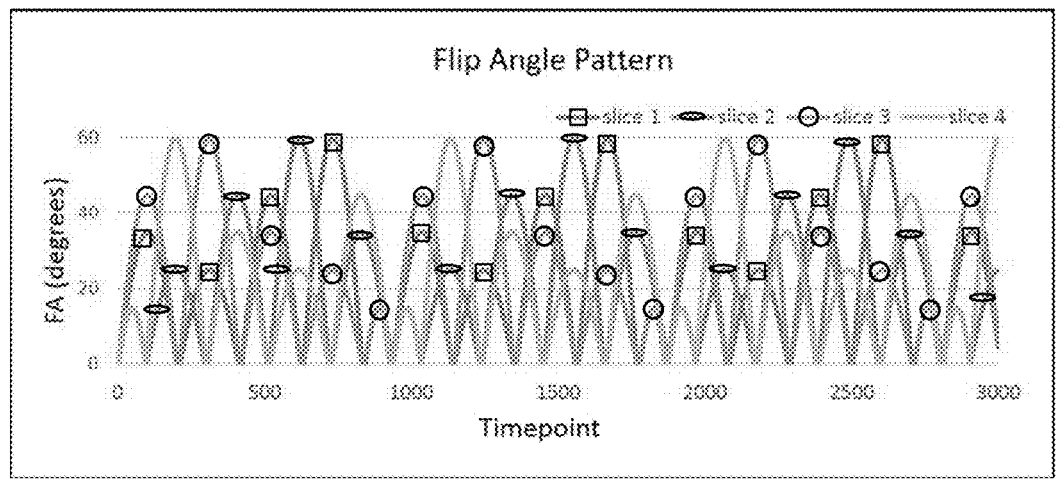
FIG. 1 is an example of a flip angle schedule that can be implemented with variable sequence blocks for acquiring magnetic resonance data.

Described here are methods for magnetic resonance fingerprinting ("MRF") that implement simultaneous multislice acquisition techniques with an RF-encoding to simultaneously acquire magnetic resonance data from multiple slices simultaneously. As one non-limiting example, magnetic resonance data can be simultaneously acquired from four different slices. In other embodiments, however, the encoding can be condensed into one or two acquisitions, rather than four.

MRF is a technique that facilitates mapping of tissue or other material properties based on random or pseudorandom measurements of the subject or object being imaged. In particular, MRF can be conceptualized as employing a series of varied "sequence blocks" that simultaneously produce different signal evolutions in different "resonant species" to which the RF is applied. The term "resonant species," as used herein, refers to a material, such as water, fat, bone, muscle, soft tissue, and the like, that can be made to resonate using NMR. By way of illustration, when radio frequency ("RF") energy is applied to a volume that has both bone and muscle tissue, then both the bone and muscle tissue will produce a nuclear magnetic resonance ("NMR") signal; however, the "bone signal" represents a first resonant species and the "muscle signal" represents a second resonant species, and thus the two signals will be different. These different signals from different species can be collected simultaneously over a period of time to collect an overall "signal evolution" for the volume.

The measurements obtained in MRF techniques are achieved by varying the acquisition parameters from one repetition time ("TR") period to the next, which creates a time series of signals with varying contrast. Examples of acquisition parameters that can be varied include flip angle ("FA"), RF pulse phase, TR, echo time ("TE'), and sampling patterns, such as by modifying one or more readout encoding gradients. The acquisition parameters are varied in a random manner, pseudorandom manner, or other manner that results in signals from different materials or tissues to be spatially incoherent, temporally incoherent, or both. For example, in some instances, the acquisition parameters can be varied according to a non-random or non-pseudorandom pattern that otherwise results in signals from different materials or tissues to be spatially incoherent, temporally incoherent, or both.

From these measurements, which as mentioned above may be random or pseudorandom, or may contain signals from different materials or tissues that are spatially incoherent, temporally incoherent, or both, MRF processes can be designed to map any of a wide variety of parameters. Examples of such parameters that can be mapped may include, but are not limited to, longitudinal relaxation time ($T_1$), transverse relaxation time ($T_2$), main or static magnetic field map ($B_0$), and proton density ($\rho$). MRF is generally described in U.S. Pat. No. 8,723,518 and Published U.S. Patent Application No. 2015/0301141, each of which is incorporated herein by reference in its entirety.

The data acquired with MRF techniques are compared with a dictionary of signal models, or templates, that have been generated for different acquisition parameters from magnetic resonance signal models, such as Bloch equation-based physics simulations. This comparison allows estimation of the physical parameters, such as those mentioned above. As an example, the comparison of the acquired signals to a dictionary can be performed using any suitable matching or pattern recognition technique. The parameters for the tissue or other material in a given voxel are estimated to be the values that provide the best signal matching. For instance, the comparison of the acquired data with the dictionary can result in the selection of a signal vector, which may constitute a weighted combination of signal vectors, from the dictionary that best corresponds to the observed signal evolution. The selected signal vector includes values for multiple different quantitative parameters, which can be extracted from the selected signal vector and used to generate the relevant quantitative parameter maps.

The stored signals and information derived from reference signal evolutions may be associated with a potentially very large data space. The data space for signal evolutions can be partially described by:

$$SE = \sum_{s=1}^{N_S} \prod_{i=1}^{N_A} \sum_{j=1}^{N_{RF}} R_i(\alpha) R_{RF_{ij}}(\alpha, \phi) R(G) E_i(T_1, T_2, D) M_0; \quad (1)$$

where SE is a signal evolution; $N_S$ is a number of spins; $N_A$ is a number of sequence blocks; $N_{RF}$ is a number of RF pulses in a sequence block; $\alpha$ is a flip angle; $\phi$ is a phase angle; $R_i(\alpha)$ is a rotation due to off resonance; $R_{RF_{ij}}(\alpha,\phi)$ is a rotation due to RF differences; R (G) is a rotation due to a magnetic field gradient; $T_1$ is a longitudinal, or spin-lattice, relaxation time; $T_2$ is a transverse, or spin-spin, relaxation time; D is diffusion relaxation; $E_i$ ($T_1$, $T_2$, D) is a signal decay due to relaxation differences; and $M_0$ is the magnetization in the default or natural alignment to which spins align when placed in the main magnetic field.

While $E_i(T_1,T_2,D)$ is provided as an example, in different situations, the decay term, $E_i(T_1,T_2,D)$, may also include additional terms, $E_i(T_1,T_2,D,K)$ or may include fewer terms, such as by not including the diffusion relaxation, as $E_i(T_1, T_2)$ or $E_i(T_1, T_2,K$ . Also, the summation on "j" could be replace by a product on "j".

The dictionary may store signals described by, $$S_i = R_i E_i(S_{i-1}) \quad (2);$$

where $S_0$ is the default, or equilibrium, magnetization; S, is a vector that represents the different components of magnetization, $M_x$, $M_y$, and $M_z$ during the $i^{th}$ acquisition block; $R_i$ is a combination of rotational effects that occur during the $i^{th}$ acquisition block; and $E_i$ is a combination of effects that alter the amount of magnetization in the different states for the $i^{th}$ acquisition block. In this situation, the signal at the $i^{th}$ acquisition block is a function of the previous signal at acquisition block (i.e., the $(i-1)^{th}$ acquisition block). Additionally or alternatively, the dictionary may store signals as a function of the current relaxation and rotation effects and of previous acquisitions. Additionally or alternatively, the dictionary may store signals such that voxels have multiple resonant species or spins, and the effects may be different for every spin within a voxel. Further still, the dictionary may store signals such that voxels may have multiple resonant species or spins, and the effects may be different for spins within a voxel, and thus the signal may be a function of the effects and the previous acquisition blocks.

Relaxation times and other quantitative parameters can be measured efficiently with MRF, but further acceleration of MRF is difficult because individual images are already highly undersampled. As will be described, the present disclosure provides an MRF framework for accelerating MRF by using simultaneous multislice acquisition techniques that use a suitable RF-encoding to simultaneously acquire magnetic resonance data from multiple slices simultaneously. As one non-limiting example, magnetic resonance data can be simultaneously acquired from four different slices. In other embodiments, however, the RF-encoding can be condensed into one or two acquisitions, rather than four.

In general, the RF-encoding is provided using a coding matrix to modulate the slice profiles associated with the multiband RF pulse. As such, the matrix values in the coding matrix are used to modulate the slice profiles. As one non-limiting example, the slice profiles for the multiband RF pulse can be modulated using a second-order Hadamard matrix having the following form:

$$H_2 = \begin{bmatrix} 1 & 1 \\ 1 & -1 \end{bmatrix}. \tag{3}$$

For instance, the phase for different slices excited using the multiband RF pulse can be modulated according to the Hadamard matrix, or other suitable coding matrix. It will be appreciated that different Hadamard matrices could also be used to provide the phase profiles for the multiband RF pulses. For instance, a higher-order Hadamard matrix could be used. A higher-order Hadamard matrix can be useful when data from more than four slices are simultaneously acquired. In some other implementations, a coding matrix different than a Hadamard matrix could also be used to modulate the slice profiles for the multiband RF pulses. For instance, a coding matrix could be designed based on a Golay code, or other suitable code. In those instances where the coding matrix has values of 1 s and 0 s, the zero values can be replaced with "−1" as desired.

In an example study, a fast imaging with steady-state precession ("FISP")-based MRF sequence was modified for simultaneous multislice experiments with the following parameters: 3000 frames, matrix size 256×256, field-of-view ("FOV") 300 mm. A uniform density spiral trajectory that implemented 48 arms to fully sample the k-space was used, with only one spiral arm sampled per frame. A multiband RF pulse was designed to excite four adjacent slices simultaneously with variable flip angles for each slice at each time point.

In this example, flip angles were varied smoothly between 0 and 60 degrees for each slice. The flip angles were designed with an interleaved pattern between slices to reduce the peak RF amplitude, which has a maximum flip angle of 120.33 degrees. An example of the flip angle schedule is shown in FIG. 1. The TR was kept constant at 10 ms. An MRF dictionary was built for each flip angle pattern using Bloch equation simulations of 5098 T1 and T2 combinations, leading to a dictionary of dimensions 3000 timepoints×5098 T1 and T2 combinations.

Figure 2:
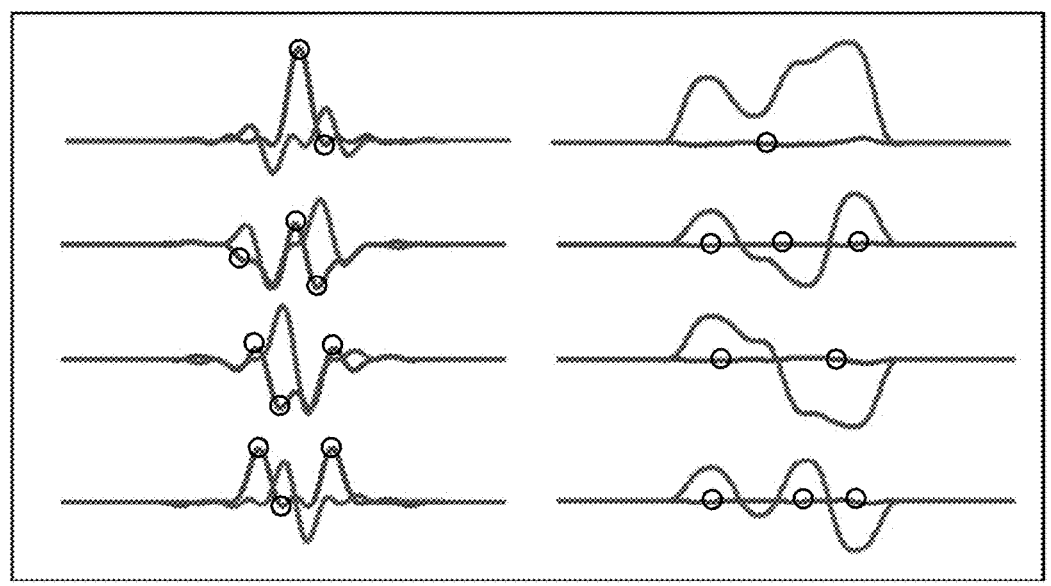
FIG. 2 is an example of multiband RF pulses that implement RF-encoding through a varied phase profile.

In order to separate simultaneously acquired slices, a phase modulation was added to the RF pulse to incorporate Hadamard RF encoding. An example of such RF pulses and their corresponding slice profiles are shown in FIG. 2.

Figure 3:
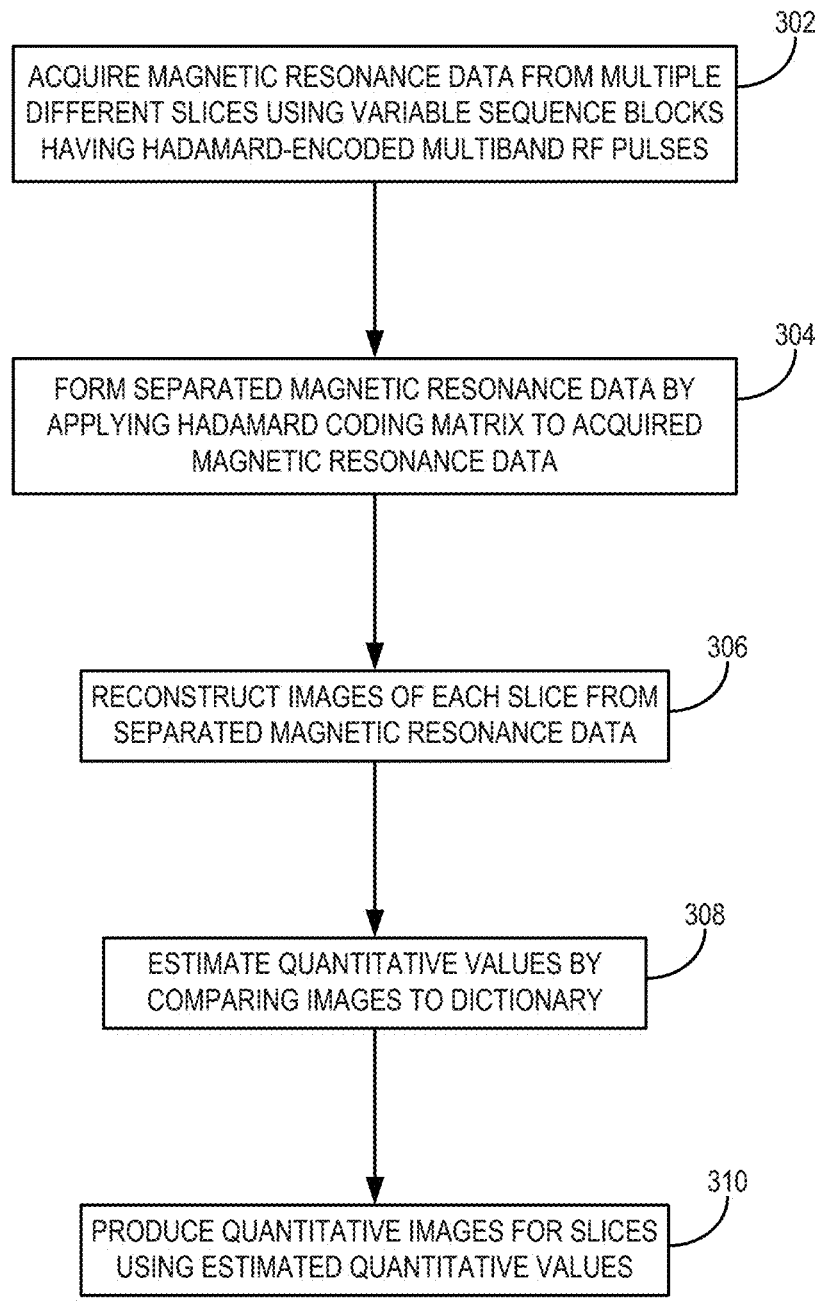
FIG. 3 is a flowchart setting forth the steps of an example method for producing quantitative images of a subject in multiple different slices using MRF with a multislice acquisition that implement RF-encoding.

Referring now to FIG. 3, a flowchart is illustrated as setting forth the steps of an example method for producing quantitative images of a subject using an MRF technique that utilizes Hadamard RF-encoding for simultaneous multislice acquisitions. The method includes using an MRI system, or other nuclear magnetic resonance ("NMR") system, to acquire magnetic resonance data in a series of variable sequence blocks to cause one or more resonant species in the subject to simultaneously produce individual magnetic resonance signals, as indicated at step 302. The variable sequence blocks include a multiband RF pulse that causes the one or more resonance species in the subject to simultaneously produce the individual magnetic resonance signals in a plurality of different slices. The multiband RF pulses are designed to provide a Hadamard RF encoding of the magnetic resonance signals.

As described above, magnetic resonance data acquired with an MRF technique generally includes data containing random measurements, pseudorandom measurements, or measurements obtained in a manner that results in spatially incoherent signals, temporal incoherent signals, or spatiotemporally incoherent signals. For instance, such data can be acquired by varying acquisition parameters from one TR period to the next, which creates a time series of signals with varying contrast. Using this series of varied sequence blocks simultaneously produces different signal evolutions in different resonant species to which RF energy is applied.

As an example, data are acquired using a pulse sequence where effectuating the pulse sequence includes controlling an NMR apparatus (e.g., an MRI system) to apply RF energy to a volume in an object being imaged. The volume may contain one or more resonant species, such as tissue, fat, water, hydrogen, and prosthetics.

The RF energy may be applied in a series of variable sequence blocks. As described in the present disclosure, the RF energy includes one or more multiband RF pulses that provide a Hadamard RF-encoding. By modulating the RF phase between acquisitions, slice profiles can be Hadamard-encoded and signal evolutions from multiple slices can be separated. Using the methods described in the present disclosure, 2 mm slices with near-isotropic resolution can be achieved obtained.

Sequence blocks may vary in a number of parameters including, but not limited to, echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and amount of gradient spoiling.

Depending upon the imaging or clinical need, two, three, four, or more parameters may vary between sequence blocks. The number of parameters varied between sequence blocks may itself vary. For example, a first sequence block may differ from a second sequence block in five parameters, the second sequence block may differ from a third sequence block in seven parameters, the third sequence block may differ from a fourth sequence block in two parameters, and so on. One skilled in the art will appreciate that there are a very-large number of series of sequence blocks that can be created by varying this large number of parameters. A series of sequence blocks can be crafted so that the series have different amounts (e.g., 1%, 2%, 5%, 10%, 50%, 99%, 100%) of unique sequence blocks as defined by their varied parameters. A series of sequence blocks may include more than ten, more than one hundred, more than one thousand, more than ten thousand, and more than one hundred thousand sequence blocks. In one example, the only difference between consecutive sequence blocks may be the number or parameters of excitation pulses.

Regardless of the particular imaging parameters that are varied or the number or type of sequence blocks, the RF energy applied during a sequence block is configured to cause different individual resonant species to simultaneously produce individual magnetic resonance signals. As described in the present disclosure, this RF energy can further be applied in order to simultaneously provide Hadamard RF-encoding of the individual magnetic resonance signals in multiple different slices.

Unlike conventional imaging techniques, in an MRF pulse sequence, at least one member of the series of variable sequence blocks will differ from at least one other member of the series of variable sequence blocks in at least N sequence block parameters, where N is an integer greater than one. One skilled in the art will appreciate that the signal content of a signal evolution may vary directly with N. Thus, as more parameters are varied, a potentially richer signal is retrieved. Conventionally, a signal that depends on a single parameter is desired and required to facilitate imaging. Here, acquiring signals with greater information content facilitates producing more distinct, and thus more matchable, signal evolutions.

The pulse sequence used to acquire the provided data may apply members of the series of variable sequence blocks according to a partially random or pseudo-random acquisition plan configured to undersample the object at an undersampling rate, R. In different situations, the undersampling rate, R, may be, for example, two, four, or greater.

Unlike conventional MRI imaging processes, where the time during which an imaging-relevant NMR signal can be acquired is severely limited (e.g., 4-5 seconds), the NMR apparatus can be controlled to acquire NMR signal for significantly longer periods of time. For example, the NMR apparatus can be controlled to acquire signal for up to ten seconds, for up to twenty seconds, for up to one hundred seconds, or longer. NMR signals can be acquired for longer periods of time because signal information content remains viable for longer periods of time in response to the series of varied RF energy applied. In different situations, the information content in the signal evolution may remain above an information content threshold for at least five seconds, for at least ten seconds, for at least sixty seconds, or for longer. An information content threshold may describe, for example, the degree to which a subsequent signal acquisition includes information that can be retrieved and that differs from information acquired in a previous signal acquisition. For example, a signal that has no retrievable information would likely fall below an information content threshold while a signal with retrievable information that differs from information retrieved from a previous signal would likely be above the information content threshold.

Referring still to FIG. 3, the acquired magnetic resonance data are processed to form separated magnetic resonance data, in which magnetic resonance signals are separated into the different slices from which the signals originated, as indicated at step 304. Because the RF energy applied in the variable sequence blocks implemented a Hadamard RF-encoding, the separated magnetic resonance data can be generated by applying a suitable Hadamard coding matrix (e.g., a Hadamard decoding matrix). For instance, if the Hadamard matrix shown in Eqn. (3) is used to provide the RF encoding, then its inverse can be used to provide decoding of the acquired magnetic resonance signals.

The separated magnetic resonance data are then reconstructed, as indicated at step 306, and matched to the appropriate MRF dictionary, as indicated at step 308. For example, matching the reconstructed images to the appropriate MRF dictionary can include comparing the images to a dictionary of signal evolutions to determine quantitative values for two or more parameters of the resonant species based, at least in part, on matching the separated magnetic resonance data to a set of known signal evolutions stored in the dictionary. One or more images depicting the subject are then produced based, at least in part, on the quantitative values, as indicated at step 310.

In some instances, slice profile effects may affect the estimation of in vivo T2 values, such as by lowering the estimated values. To correct for these slice profile effects, the slice profile can be simulated into the dictionary and corrected for during the dictionary matching process.

In some embodiments, an iterative reconstruction algorithm can be implemented to reduce the number of images required without significantly affecting parameter map quality.

Figure 4:
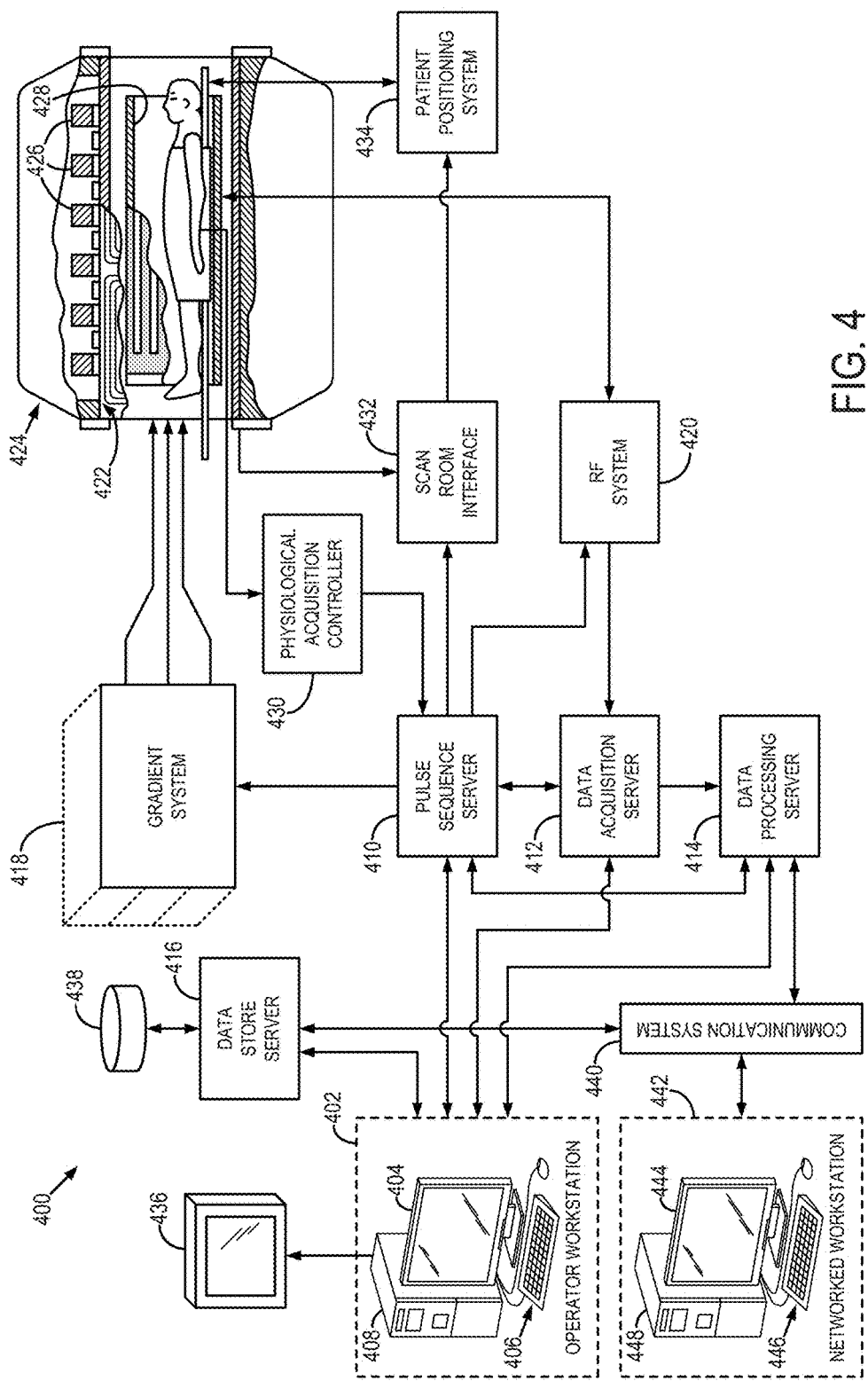
FIG. 4 is a block diagram of an example magnetic resonance imaging ("MRI") system that can implement the methods described in the present disclosure.

Referring particularly now to FIG. 4, an example of an MRI system 400 that can implement the methods described here is illustrated. The MRI system 400 includes an operator workstation 402 that may include a display 404, one or more input devices 406 (e.g., a keyboard, a mouse), and a processor 408. The processor 408 may include a commercially available programmable machine running a commercially available operating system. The operator workstation 402 provides an operator interface that facilitates entering scan parameters into the MRI system 400. The operator workstation 402 may be coupled to different servers, including, for example, a pulse sequence server 410, a data acquisition server 412, a data processing server 414, and a data store server 416. The operator workstation 402 and the servers 410, 412, 414, and 416 may be connected via a communication system 440, which may include wired or wireless network connections.

The pulse sequence server 410 functions in response to instructions provided by the operator workstation 402 to operate a gradient system 418 and a radiofrequency ("RF") system 420. Gradient waveforms for performing a prescribed scan are produced and applied to the gradient system 418, which then excites gradient coils in an assembly 422 to produce the magnetic field gradients $G_x$, $G_y$, and $G_z$ that are used for spatially encoding magnetic resonance signals. The gradient coil assembly 422 forms part of a magnet assembly 424 that includes a polarizing magnet 426 and a whole-body RF coil 428.

RF waveforms are applied by the RF system 420 to the RF coil 428, or a separate local coil to perform the prescribed magnetic resonance pulse sequence. Responsive magnetic resonance signals detected by the RF coil 428, or a separate local coil, are received by the RF system 420. The responsive magnetic resonance signals may be amplified, demodulated, filtered, and digitized under direction of commands produced by the pulse sequence server 410. The RF system 420 includes an RF transmitter for producing a wide variety of RF pulses used in MRI pulse sequences. The RF transmitter is responsive to the prescribed scan and direction from the pulse sequence server 410 to produce RF pulses of the desired frequency, phase, and pulse amplitude waveform. The generated RF pulses may be applied to the whole-body RF coil 428 or to one or more local coils or coil arrays.

The RF system 420 also includes one or more RF receiver channels. An RF receiver channel includes an RF preamplifier that amplifies the magnetic resonance signal received by the coil 428 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \tag{4};$$

and the phase of the received magnetic resonance signal may also be determined according to the following relationship:

$$\varphi = \tan^{-1}\left(\frac{Q}{I}\right). \quad (5)$$

The pulse sequence server 410 may receive patient data from a physiological acquisition controller 430. By way of example, the physiological acquisition controller 430 may receive signals from a number of different sensors connected to the patient, including electrocardiograph ("ECG") signals from electrodes, or respiratory signals from a respiratory bellows or other respiratory monitoring devices. These signals may be used by the pulse sequence server 410 to synchronize, or "gate," the performance of the scan with the subject's heart beat or respiration.

The pulse sequence server 410 may also connect to a scan room interface circuit 432 that receives signals from various sensors associated with the condition of the patient and the magnet system. Through the scan room interface circuit 432, a patient positioning system 434 can receive commands to move the patient to desired positions during the scan.

The digitized magnetic resonance signal samples produced by the RF system 420 are received by the data acquisition server 412. The data acquisition server 412 operates in response to instructions downloaded from the operator workstation 402 to receive the real-time magnetic resonance data and provide buffer storage, so that data is not lost by data overrun. In some scans, the data acquisition server 412 passes the acquired magnetic resonance data to the data processor server 414. In scans that require information derived from acquired magnetic resonance data to control the further performance of the scan, the data acquisition server 412 may be programmed to produce such information and convey it to the pulse sequence server 410. For example, during pre-scans, magnetic resonance data may be acquired and used to calibrate the pulse sequence performed by the pulse sequence server 410. As another example, navigator signals may be acquired and used to adjust the operating parameters of the RF system 420 or the gradient system 418, or to control the view order in which k-space is sampled. In still another example, the data acquisition server 412 may also process magnetic resonance signals used to detect the arrival of a contrast agent in a magnetic resonance angiography ("MRA") scan. For example, the data acquisition server 412 may acquire magnetic resonance data and processes it in real-time to produce information that is used to control the scan.

The data processing server 414 receives magnetic resonance data from the data acquisition server 412 and processes the magnetic resonance data in accordance with instructions provided by the operator workstation 402. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 414 are conveyed back to the operator workstation 402 for storage. Real-time images may be stored in a data base memory cache, from which they may be output to operator display 402 or a display 436. Batch mode images or selected real time images may be stored in a host database on disc storage 438. When such images have been reconstructed and transferred to storage, the data processing server 414 may notify the data store server 416 on the operator workstation 402. The operator workstation 402 may be used by an operator to archive the images, produce films, or send the images via a network to other facilities.

The MRI system 400 may also include one or more networked workstations 442. For example, a networked workstation 442 may include a display 444, one or more input devices 446 (e.g., a keyboard, a mouse), and a processor 448. The networked workstation 442 may be located within the same facility as the operator workstation 402, or in a different facility, such as a different healthcare institution or clinic.

The networked workstation 442 may gain remote access to the data processing server 414 or data store server 416 via the communication system 440. Accordingly, multiple networked workstations 442 may have access to the data processing server 414 and the data store server 416. In this manner, magnetic resonance data, reconstructed images, or other data may be exchanged between the data processing server 414 or the data store server 416 and the networked workstations 442, such that the data or images may be remotely processed by a networked workstation 442.

The present disclosure has described one or more preferred embodiments, and it should be appreciated that many equivalents, alternatives, variations, and modifications, aside from those expressly stated, are possible and within the scope of the invention.

The invention claimed is:

1. A method for generating quantitative images of a subject, the method comprising:
   (a) using a magnetic resonance imaging (MRI) system to acquire magnetic resonance data in a series of variable sequence blocks having a multiband radio frequency (RF) pulse and that cause one or more resonant species in the subject to simultaneously produce individual magnetic resonance signals in a plurality of different slices, and wherein the multiband RF pulse provides an RF encoding of the magnetic resonance signals according to matrix entries in a coding matrix;
   (b) applying the coding matrix to the acquired magnetic resonance data in order to generate separated magnetic resonance data in which each of the magnetic resonance signals are separated into one of the plurality of different slice locations from which the magnetic resonance signal originated;
   (c) comparing the separated magnetic resonance data to a dictionary of signal evolutions to determine quantitative values for two or more parameters of the resonant species based, at least in part, on matching the separated magnetic resonance data to a set of known signal evolutions stored in the dictionary; and
   (d) displaying an image for each of the plurality of different slice locations depicting the subject at that slice location based, at least in part, on the quantitative values.

2. The method as recited in claim 1, wherein the coding matrix is a Hadamard matrix.

3. The method as recited in claim 1, wherein the matrix entries in the coding matrix are used to modulate a phase of slice profiles corresponding to the plurality of different slices.

4. The method as recited in claim 1, wherein applying the coding matrix to the acquired magnetic resonance data comprises applying an inverse of the coding matrix to the acquired magnetic resonance data.

5. The method as recited in claim 1, wherein the plurality of different slice locations comprises four different slice locations.

6. The method as recited in claim 1, wherein at least one member of the series of variable sequence blocks differs from at least one other member of the series of variable sequence blocks in at least two sequence block parameters.

7. The method as recited in claim 6, wherein the at least two sequence block parameters includes a flip angle for each of the plurality of different slice locations.

8. The method as recited in claim 7, wherein the flip angle is varied from one member of the variable sequence blocks to a next member of the series of variable sequence blocks.

9. The method as recited in claim 8, wherein the flip angle is varied from one member of the variable sequence blocks to the next member of the series of variable sequence blocks according to an interleaved pattern.

10. The method as recited in claim 1, wherein the dictionary of signal evolutions includes signal evolutions based at least in part on a variable flip angle pattern for each of the plurality of different slice locations.

11. The method as recited in claim 10, wherein the variable flip angle pattern for at least one of the plurality of different slice locations is an interleaved flip angle pattern.

12. The method as recited in claim 1, wherein the dictionary of signal evolutions includes signal evolutions based at least in part on a slice profile for each of the plurality of different slice locations in order to reduce slice profile effects on the determined quantitative values.

13. A system for generating quantitative images of a subject, the system comprising:
   a magnet system configured to generate a static magnetic field about at least a portion of a subject;
   a magnetic gradient system including a plurality of magnetic gradient coils configured to apply at least one magnetic gradient field to the polarizing magnetic field;
   a radio frequency (RF) system configured to apply an RF field to the subject and to receive magnetic resonance signals from the subject using a coil array;
   a computer system programmed to:
      (a) control the magnetic gradient system and the RF system to acquire magnetic resonance data in a series of variable sequence blocks having a multiband radio frequency (RF) pulse and that cause one or more resonant species in the subject to simultaneously produce individual magnetic resonance signals in a plurality of different slices, and wherein the multiband RF pulse provides an RF encoding of the magnetic resonance signals;
      (b) apply a coding matrix to the acquired magnetic resonance data to generate separated magnetic resonance data in which each of the magnetic resonance signals are separated into one of the plurality of different slice locations from which the magnetic resonance signal originated;
      (c) compare the separated magnetic resonance data to a dictionary of signal evolutions to determine quantitative values for two or more parameters of the resonant species based, at least in part, on matching the separated magnetic resonance data to a set of known signal evolutions stored in the dictionary; and
   a display configured to display an image for each of the plurality of different slice locations depicting the subject at that slice location based, at least in part, on the quantitative values.

14. The system as recited in claim 13, wherein the plurality of different slice locations comprises four different slice locations.

15. The system as recited in claim 13, wherein at least one member of the series of variable sequence blocks differs from at least one other member of the series of variable sequence blocks in at least two sequence block parameters.

16. The system as recited in claim 15, wherein the at least two sequence block parameters includes a flip angle for each of the plurality of different slice locations.

17. The system as recited in claim 16, wherein the computer system is further configured to vary the flip angle from one member of the variable sequence blocks to a next member of the series of variable sequence blocks.

18. The system as recited in claim 17, wherein the computer system is further configured to vary the flip angle from one member of the variable sequence blocks to the next member of the series of variable sequence blocks according to an interleaved pattern.

19. The system as recited in claim 13, wherein the dictionary of signal evolutions includes signal evolutions based at least in part on a variable flip angle pattern for each of the plurality of different slice locations.

20. The system as recited in claim 19, wherein the computer system is configured to interleave flip angle patterns using the variable flip angle pattern for at least one of the plurality of different slice locations.

21. The system as recited in claim 13, wherein the dictionary of signal evolutions includes signal evolutions based at least in part on a slice profile for each of the plurality of different slice locations in order to reduce slice profile effects on the determined quantitative values.

* * * * *